United States Patent
Min

(10) Patent No.: US 9,685,487 B2
(45) Date of Patent: Jun. 20, 2017

(54) ORGANIC LIGHT EMITTING DIODE DISPLAY AND METHOD OF MANUFACTURING THE SAME

(71) Applicant: SAMSUNG DISPLAY CO., LTD., Yongin, Gyeonggi-Do (KR)

(72) Inventor: Kyoung Wook Min, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/990,452

(22) Filed: Jan. 7, 2016

(65) Prior Publication Data
US 2016/0260782 A1 Sep. 8, 2016

(30) Foreign Application Priority Data
Mar. 3, 2015 (KR) .................. 10-2015-0029797

(51) Int. Cl.
*H01L 51/52* (2006.01)
*H01L 27/32* (2006.01)
*H01L 51/56* (2006.01)
*H01L 51/00* (2006.01)
*H01L 51/50* (2006.01)

(52) U.S. Cl.
CPC ...... *H01L 27/3223* (2013.01); *H01L 27/3246* (2013.01); *H01L 27/3248* (2013.01); *H01L 51/0007* (2013.01); *H01L 51/5012* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 7,795,800 B2 | 9/2010 | Lee et al. | |
| 8,454,403 B2 | 6/2013 | Seki et al. | |
| 2006/0061266 A1* | 3/2006 | Kang | H01L 27/3246 313/504 |
| 2008/0231566 A1* | 9/2008 | Naugler | G09G 3/3291 345/82 |
| 2008/0238953 A1* | 10/2008 | Ogura | G09G 3/3275 345/697 |
| 2009/0224248 A1* | 9/2009 | Yoon | H01L 27/124 257/59 |
| 2010/0019656 A1* | 1/2010 | Yu | H01L 27/322 313/504 |
| 2015/0357388 A1* | 12/2015 | Pang | H01L 27/3223 257/40 |
| 2016/0164033 A1* | 6/2016 | Moon | H01L 51/5253 257/40 |

FOREIGN PATENT DOCUMENTS

| | | |
|---|---|---|
| JP | 2005-148335 A | 6/2005 |
| KR | 10-2010-0065745 A | 6/2010 |
| KR | 10-2012-0125888 A | 11/2012 |

* cited by examiner

*Primary Examiner* — Michael Lebentritt
(74) *Attorney, Agent, or Firm* — Lee & Morse, P.C.

(57) ABSTRACT

An organic light emitting diode display includes a substrate, a display pixel unit that displays an image, the display pixel unit being on the substrate, and a dummy pixel unit near the display pixel unit on the substrate. The display pixel unit includes a first electrode on the substrate, an organic emission layer on the first electrode, and a second electrode on the organic emission layer. The dummy pixel unit includes a second electrode formed on the substrate and does not include an organic emission layer.

13 Claims, 10 Drawing Sheets

ORGANIC LIGHT EMITTING DIODE DISPLAY AND METHOD OF MANUFACTURING THE SAME

CROSS-REFERENCE TO RELATED APPLICATION

Korean Patent Application No. 10-2015-0029797, filed on Mar. 3, 2015, in the Korean Intellectual Property Office, and entitled: "Organic Light Emitting Diode Display and Method of Manufacturing the Same," is incorporated by reference herein in its entirety.

BACKGROUND

1. Field

Embodiments relate to an organic light emitting diode display and a manufacturing method thereof.

2. Description of the Related Art

Display devices include a liquid crystal display (LCD), a plasma display panel (PDP), an organic light emitting diode (OLED) device, a field effect display (FED), an electrophoretic display device, or the like.

Particularly, the OLED device includes two electrodes and an organic emission layer positioned therebetween. In an OLED device, an electron injected from one electrode and a hole injected from the other electrode are coupled with each other in the organic emission layer to generate an exciton, and the exciton emits energy to emit light.

The OLED device has a self-luminance characteristic and does not require a separate light source, unlike the LCD. Accordingly, thickness and weight thereof may be reduced. The OLED device may be desirable characteristics such as low power consumption, high luminance, and a high response speed.

SUMMARY

Embodiments are directed to an organic light emitting diode display including a substrate, a display pixel unit that displays an image, the display pixel unit being on the substrate, and a dummy pixel unit near the display pixel unit on the substrate. The display pixel unit includes a first electrode on the substrate, an organic emission layer on the first electrode, and a second electrode on the organic emission layer. The dummy pixel unit includes a second electrode formed on the substrate and does not include an organic emission layer.

The display pixel unit may further include a hole injection layer on the first electrode, a hole transporting layer between the hole injection layer and the organic emission layer, and an electron transporting layer between the organic emission layer and the second electrode.

The display pixel unit may further include an electron injection layer between the electron transporting layer and the second electrode.

The dummy pixel unit may further include an electron transporting layer between the substrate and the second electrode.

The dummy pixel unit may further include a hole injection layer between the substrate and the electron transporting layer.

The organic light emitting diode display may further include a thin film transistor between the substrate and the display pixel unit, the thin film transistor being connected to the first electrode of the display pixel unit.

The thin film transistor may include an active layer positioned on the substrate, a gate electrode positioned on the active layer, and a source electrode and a drain electrode positioned on the gate electrode and connected to the active layer, the drain electrode being connected to the first electrode of the display pixel unit.

Embodiments are also directed to a method for manufacturing an organic light emitting diode display including providing a substrate including a display pixel area that displays an image and a dummy pixel area formed near the display pixel area, forming a first electrode on the substrate in the display pixel area, forming a pixel definition layer defining a pixel area on the first electrode in the display pixel area, dripping an emission material and a solvent dissolved with the emission material onto the display pixel area, dripping a solvent without the emission material onto the dummy pixel area on the substrate, drying the substrate onto which the emission material and the solvent are dripped, and forming a second electrode in the display pixel area and the dummy pixel area on the substrate.

The method may further include, before dripping the emission material and the solvent in the display pixel area, forming a hole injection layer on the first electrode in the display pixel area, and forming a hole transporting layer on the hole injection layer.

The method may further include, after drying the substrate and before forming the second electrode, forming an electron transporting layer in the display pixel area and the dummy pixel area of the substrate.

Forming the hole injection layer may include forming the hole injection layer in the dummy pixel area.

The method may further include, before forming the first electrode, forming a thin film transistor in the display pixel area on the substrate.

The thin film transistor may include an active layer positioned on the substrate, a gate electrode positioned on the active layer, and a source electrode and a drain electrode positioned on the gate electrode and connected to the active layer, the drain electrode being connected to the first electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
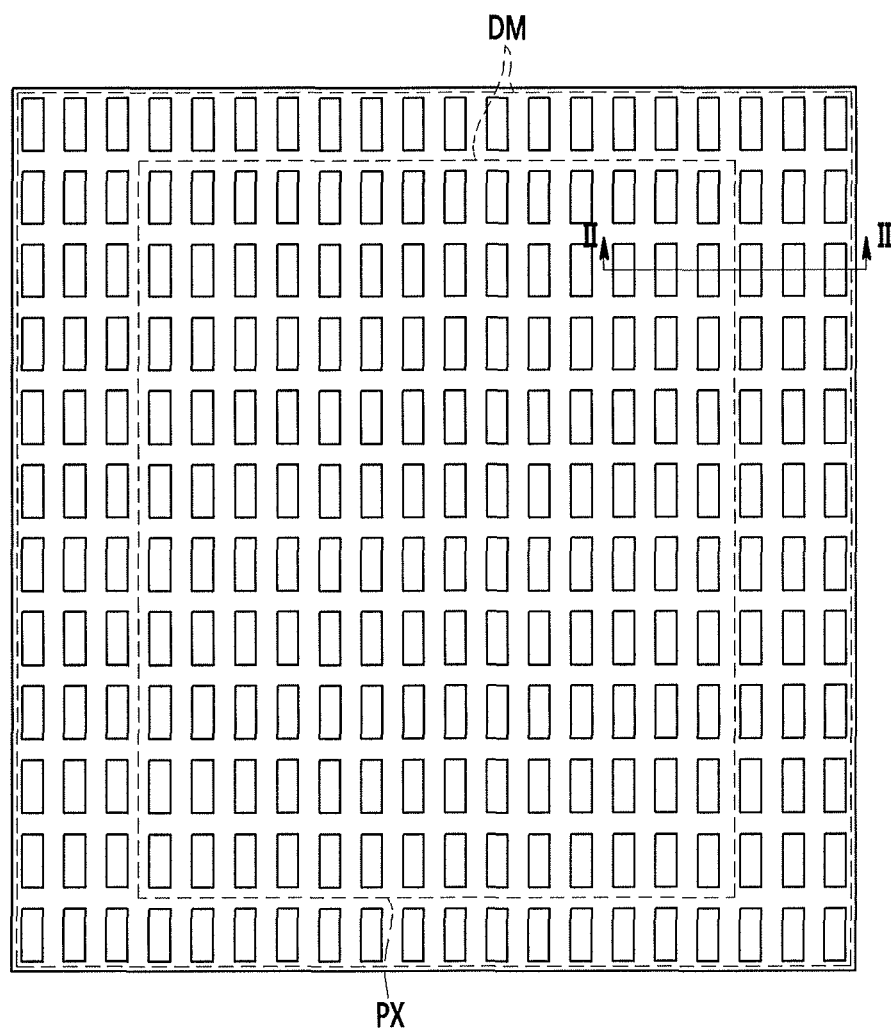
FIG. 1 illustrates a layout view of an organic light emitting diode display according to an exemplary embodiment formed with a display pixel unit and a dummy pixel unit.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Next, an organic light emitting diode display according to an exemplary embodiment will be described with reference to FIG. 1 to FIG. 3.

Figure 2:
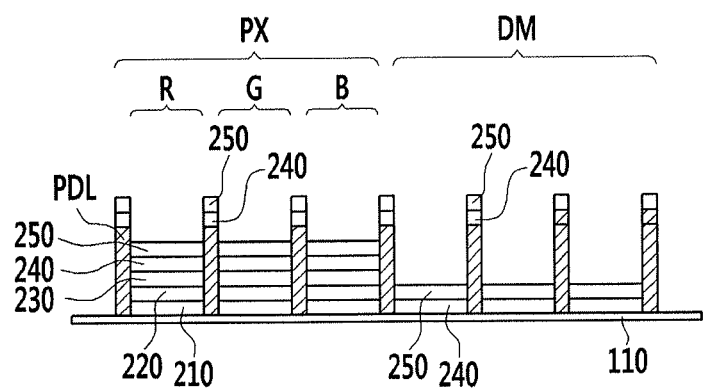
FIG. 2 illustrates a cross-sectional view of the organic light emitting diode display according to an exemplary embodiment of FIG. 1 taken along a line II-II.
Figure 3:
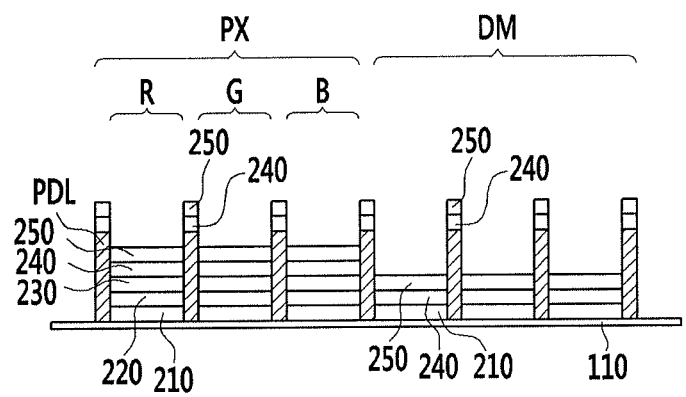
FIG. 3 illustrates a cross-sectional view of the organic light emitting diode display according to an exemplary variation of an exemplary embodiment of FIG. 1 taken along the line II-II.

FIG. 1 illustrated a layout view of an organic light emitting diode display according to an exemplary embodiment, the organic light emitting diode display being formed with a display pixel unit and a dummy pixel unit, FIG. 2 illustrates a cross-sectional view of the organic light emitting diode display illustrated in FIG. 1 taken along a line II-II, and FIG. 3 illustrates a cross-sectional view of the organic light emitting diode display illustrated in FIG. 1 taken along the line II-II, according to an exemplary variation.

Referring to FIG. 1 and FIG. 2, in an organic light emitting diode display according to an exemplary embodiment, the display pixel unit PX includes an organic emission layer 230, and the dummy pixel unit DM does not include the organic emission layer.

For example, in the manufacturing method of the organic light emitting diode display that will be described below, the emission material and a solvent dissolved with the emission material may be dripped onto a substrate in a display pixel unit PX, and only the solvent may be dripped onto the dummy pixel unit DM. When the display pixel unit PX and the dummy pixel unit DM are dried, the organic emission layer 230 may be formed in the display pixel unit PX, but the organic emission layer is nor formed in the dummy pixel unit DM. The detailed description thereof will be given below.

Referring to FIG. 1, the organic light emitting diode display according to an exemplary embodiment may include the display pixel unit PX made of a plurality of pixels displaying the image, and the dummy pixel unit DM formed near the display pixel unit PX.

In the display pixel unit PX, one pixel may be formed of a plurality of sub-pixels. For example, one pixel may be formed of a red sub-pixel, a green sub-pixel, and a blue sub-pixel. The red sub-pixel may include a red organic emission layer, the green sub-pixel may include a green organic emission layer, and the blue sub-pixel may include a blue organic emission layer. The red organic emission layer, the green organic emission layer, and the blue organic emission layer may realize a color image of red, green, and blue, respectively. In FIG. 2, the display pixel unit PX will be described based on one pixel made of the red, the green, and the blue sub-pixels.

Figure 8:
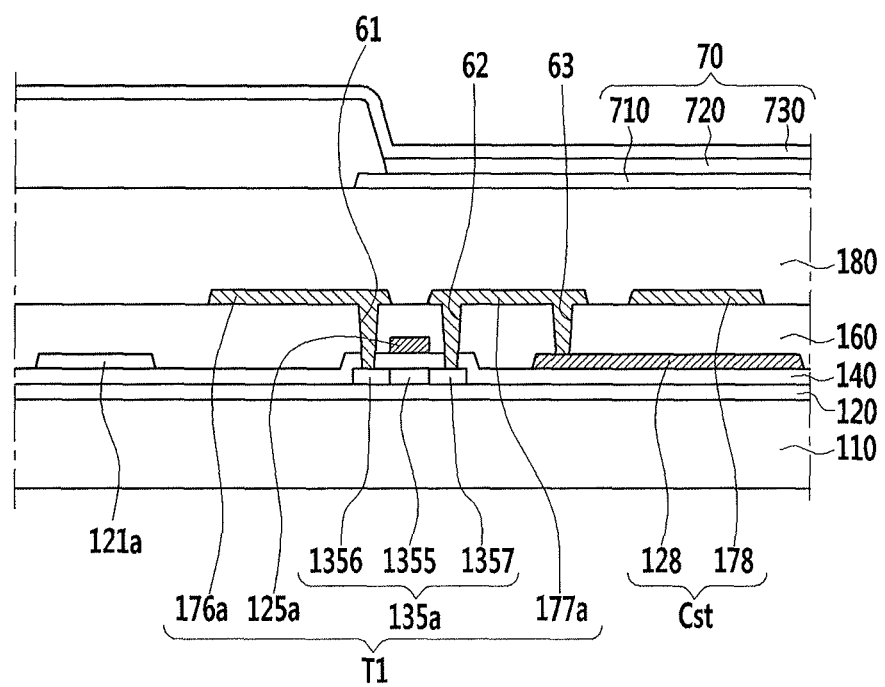
FIG. 8 illustrates a cross-sectional view of the organic light emitting diode display of FIG. 7 taken along a line VIII-VIII.
Figure 9:
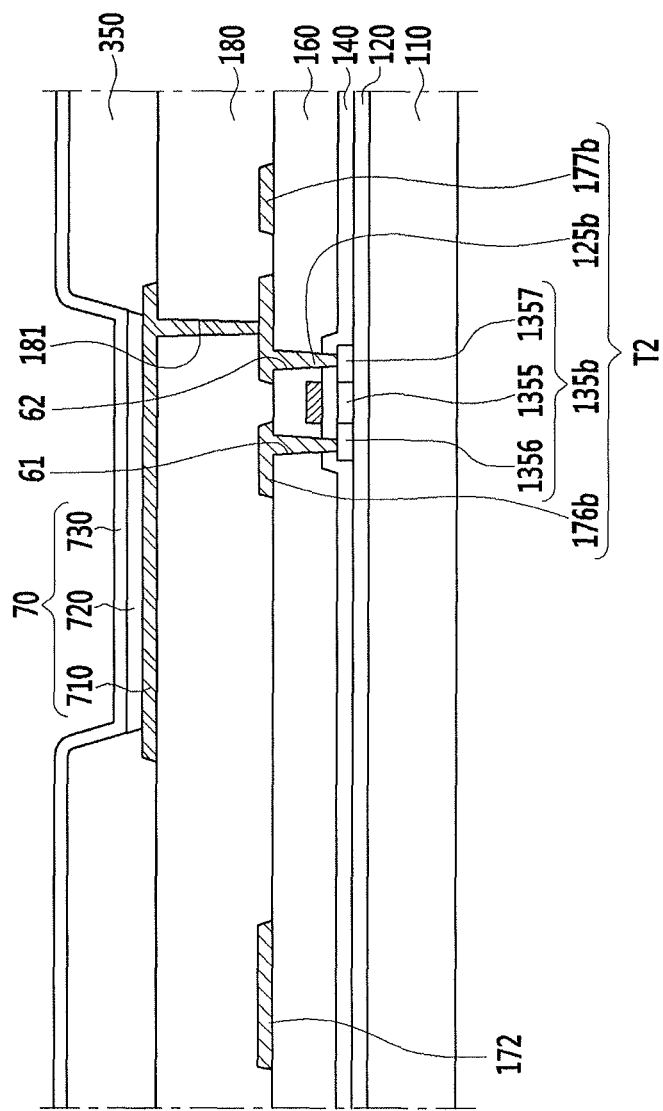
FIG. 9 illustrates a cross-sectional view of the organic light emitting diode display of FIG. 7 taken along a line IX-IX.

Referring to FIG. 2, the display pixel unit PX may be formed of the red, the green, and the blue sub-pixels R, G, and B. In FIG. 2, the red, the green, and the blue sub-pixels R. G, and B may be divided by a pixel definition layer PDL. Each sub-pixel may include a first electrode (for example, a pixel electrode 710 as shown in FIGS. 8 and 9), an organic emission layer 230, and a second electrode 250.

The first electrode may be formed of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium(LiF/Ca), lithium fluoride/aluminum (LiF/Al), aluminum (Al), silver (Ag), magnesium (Mg), or gold (Au). The first electrode may be electrically connected to a driving drain electrode of a driving thin film transistor T2 that will be described below, thereby being an anode of the organic light emitting element.

A thin film transistor may be included under the first electrode. The thin film transistor may include a switching transistor and a driving transistor. Next, the structure of one pixel of the organic light emitting diode display will be described in detail.

The organic emission layer 230 may be formed on the first electrode, thereby realizing the color image of red, green, or blue. According to an exemplary embodiment, in the manufacturing process of the organic light emitting diode display, when the organic emission material and the solvent dissolved with the organic emission material are dripped and dried on the substrate, the organic emission layer 230 of the display pixel unit PX may be formed. For example, after performing the drying process, the organic emission material is formed the organic emission layer 230.

The organic emission material may include a polymer material having solubility. The organic emission layer 230 may be formed by evaporating the solvent dissolved with the polymer material.

The second electrode 250 may be formed on the organic emission layer 230. The second electrode 250 may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The second electrode 250 may be the common electrode of the organic light emitting element. The pixel electrode, the organic emission layer 230, and a common electrode 730 form the organic light emitting element.

The organic light emitting diode display according to an exemplary embodiment may include the first electrode, the organic emission layer 230, and the second electrode 250. The organic light emitting diode display according to an exemplary variation of an exemplary embodiment may further include a hole injection layer 210 and a hole transporting layer 220 sequentially formed between the first electrode and the organic emission layer 230, as shown in FIG. 3.

An electron transporting layer 240 and an electron injection layer may be sequentially deposited between the organic emission layer 230 and the second electrode 250. In the organic light emitting diode display, a multilayer including at least one of the hole injection layer, the hole transporting layer, the electron transporting layer, and the electron injection layer may be formed.

The hole injection layer, the hole transport layer, the electron transport layer, and the electron injection layer may serve to improve the light emission efficiency of the organic light emitting layer. The hole transport layer and the electron transport layer may serve to adjust the balance between electrons and holes. The hole injection layer and the electron injection layer may serve to strengthen the injection of electrons and holes.

According to an exemplary embodiment, the dummy pixel unit DM may include the second electrode 250 formed on a substrate 110. The second electrode 250 of the dummy pixel unit DM and the second electrode 250 of the display pixel unit PX may be simultaneously formed as a same layer in the dummy pixel unit DM and the display pixel unit PX. Like the second electrode 250 of the display pixel unit PX, the second electrode 250 of the dummy pixel unit DM may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

In the organic light emitting diode display according to an exemplary embodiment, only the second electrode 250 may be formed in the dummy pixel unit DM. In some implementations, the electron transporting layer 240 may be formed under the second electrode 250. The electron transporting layer 240 in the same layer as the electron transporting layer 240 of the display pixel unit PX may be simultaneously formed in the display pixel unit PX and the dummy pixel unit DM.

According to an exemplary variation, the hole injection layer 210 may be formed under the electron transporting layer 240 of the dummy pixel unit DM. The hole injection layer 210 of the dummy pixel unit DM may be simultaneously formed with the hole injection layer 210 of the display pixel unit PX.

Referring to FIG. 2, in the dummy pixel unit DM, differently from the display pixel unit PX, the organic emission layer is not formed. As described above, in the manufacturing process of the organic light emitting diode display, in the display pixel unit PX, the organic emission material and the solvent dissolved with the organic emission material are dripped onto the substrate. However, in the dummy pixel unit DM, only the solvent without the emission material is dripped.

As described above, if only the solvent is dripped in the dummy pixel unit DM and dried, the organic emission material is not present in the dummy pixel unit DM, and the organic emission layer is not formed.

Figure 4:
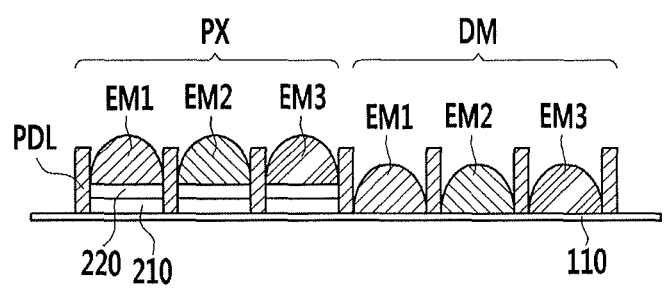
FIG. 4 illustrates a view showing an emission material and a solvent dripped in a dummy pixel unit, according to a comparative example.
Figure 5:
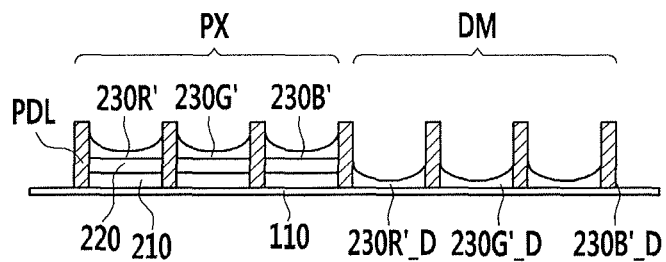
FIG. 5 illustrates a schematic cross-sectional view of an organic light emitting diode display according to the comparative example after the solvent shown in FIG. 4 is removed.

FIG. 4 illustrates a view showing an emission material and a solvent dripped in a dummy pixel unit, and FIG. 5 illustrates a schematic cross-sectional view of an organic light emitting diode display after the solvent shown in FIG. 4 is removed, according to a comparative example. In FIG. 4 and FIG. 5, different from an exemplary embodiment, the shape of the organic emission layer in the case of dripping and drying the emission material in the dummy pixel unit DM will be described.

Referring to FIG. 4, differently from the manufacturing process of the above-described organic light emitting diode display, solutions EM1, EM2, and EM3 including the emission material and the solvent may be dripped and dried onto the substrate in the dummy pixel unit as well as in the display pixel unit PX. In this case, the shape of organic emission layers 230R', 230G', and 230B' of the display pixel unit PX may not be uniform.

As shown in FIG. 5, the surface of the organic emission layers 230R', 230G', and 230B' of the display pixel unit PX near the dummy pixel unit DM may not be flat. The non-uniform shape may be generated by a coffee stain effect in which the emission material is positioned at or pulled toward the edge while the solvent is dried. This phenomenon may be mainly generated in the display pixel unit PX near the dummy pixel unit DM. Accordingly, the organic light emitting diode display may exhibit luminance non-uniformity.

According to the manufacturing process of the organic light emitting diode display of an exemplary embodiment, if the solvent without the emission material is dripped and dried in the dummy pixel unit DM, this phenomenon may be reduced.

Figure 6:
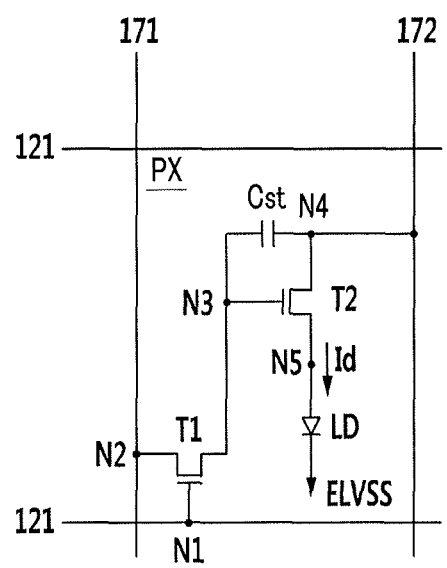
FIG. 6 illustrates an equivalent circuit diagram of one pixel of an organic light emitting diode display.
Figure 7:
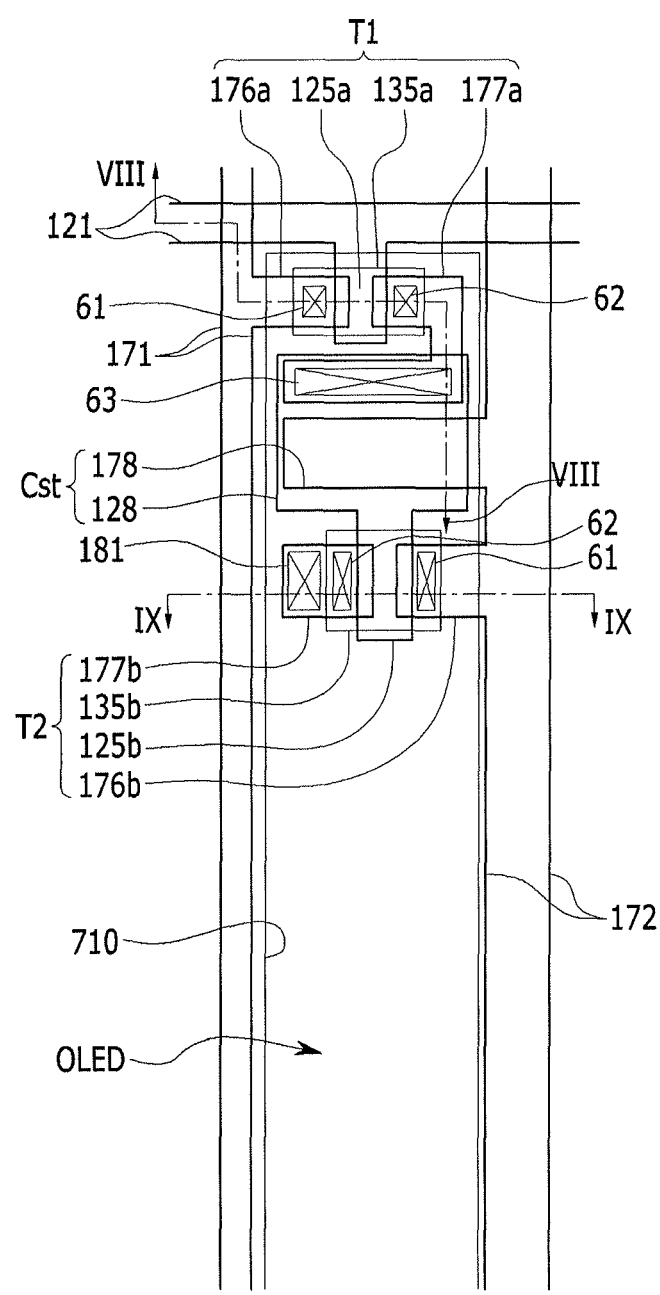
FIG. 7 illustrates a layout view of one pixel of an organic light emitting diode display.

FIG. 6 illustrates an equivalent circuit diagram of one pixel of an organic light emitting diode display, FIG. 7 illustrates a layout view of one pixel of an organic light emitting diode display, FIG. 8 illustrates a cross-sectional view of the organic light emitting diode display of FIG. 7 taken along a line VIII-VIII, and FIG. 9 illustrates a cross-sectional view of the organic light emitting diode display of FIG. 7 taken along a line IX-IX.

Referring to FIG. 6 to FIG. 9, the structure of the pixel formed in the display pixel unit PX will be described.

First, referring to FIG. 6, the organic light emitting diode display may include a plurality of signal lines 121, 171, and 172 and a sub-pixel connected thereto. The sub-pixel may be one of the red pixel (R), the green pixel (G), and the blue pixel (B). As described above, one pixel may be made of a plurality of the sub-pixels.

The signal lines include gate lines 121 for transmitting a scanning signal, data lines 171 for transmitting a data signal, a driving voltage line 172 for transmitting a driving voltage, or the like.

The gate lines 121 may substantially extend in a row direction and may be nearly parallel to each other, while the data lines 171 may substantially extend in a column direction and may be nearly parallel to each other. The driving voltage lines 172 may be illustrated to substantially extend in the column direction. In other implementations, the driving voltage lines may extend in the row or column direction or may have a net-like shape.

The sub-pixel may include a thin film transistor including a switching transistor T1 and a driving transistor T2, a storage capacitor Cst, and an organic light emitting element LD. One pixel PX may further include a thin film transistor and a capacitor to compensate a current that is supplied to the organic light emitting element LD.

The switching transistor T1 may include a control terminal N1, an input terminal N2, and an output terminal N3. The control terminal N may be connected to the gate line 121, the input terminal N2 may be connected to the data line 171, and the output terminal N3 may be connected to the driving transistor T2.

The switching transistor T1 may transmit the data signal transmitted via the data line 171 to the driving transistor T2 in response to the scanning signal transmitted via the gate line 121.

The driving transistor T2 may also include a control terminal N3, an input terminal N4, and an output terminal N5. The control terminal N3 may be connected to the switching transistor T1, the input terminal N4 may be connected to the driving voltage line 172, and the output terminal N5 may be connected to the organic light emitting element LD.

The driving transistor T2 may output an output current Id, a magnitude of which varies according to a voltage applied between the control terminal N3 and the output terminal N5.

The capacitor Cst may be connected between the control terminal N3 and the input terminal N4 of the driving transistor T2. The capacitor Cst may be charged with a data signal applied to the control terminal N3 of the driving transistor T2, and may maintain the data signal even after the switching transistor T1 is turned off.

For example, as an organic light emitting diode (OLED), the organic light emitting element LD may include an anode connected to the output terminal N5 of the driving transistor T2 and a cathode connected to a common voltage ELVSS. The organic light emitting element LD may display an image by emitting light of varying intensities according to the output current Id of the driving transistor T2.

The organic light emitting element LD may contain an organic material that represents one or more of primary colors including three thereof such as red, green, and blue. The organic light emitting diode display may display a desired image with a spatial sum of these colors.

The switching transistor T1 and the driving transistor T2 may be n-channel electric effect transistors (FETs). In some implementations, at least one of the switching transistor T1 and the driving transistor T2 may be a p-channel FET. A connection relationship between the transistors T1 and T2, the capacitor Cst, and the organic light emitting element LD may vary from what is illustrated in FIG. 6.

Next, the deposition structure of the organic light emitting diode display will be described with reference to FIG. 7 to FIG. 9.

The substrate 110 may be made of a polyimide, a polyamide, or a polyacrylate.

A buffer layer 120 may be formed on the substrate 110. The buffer layer 120 may be formed as a single layer of a silicon nitride (SiNx) or as a dual-layer in which a silicon nitride (SiNx) and a silicon oxide (SiOx) are laminated. The buffer layer 120 may serve to planarize a surface while helping to prevent permeation of unnecessary materials such as impurities or moisture.

A switching semiconductor layer 135a and a driving semiconductor layer 135b may be formed on the buffer layer 120 to be spaced apart from each other.

The semiconductor layers 135a and 135b may be formed of polysilicon or an oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (InGaZnO$_4$), indium-zinc oxide (In—Zn—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

When the semiconductor layers 135a and 135b are formed of an oxide semiconductor, a separate passivation layer may be added to protect the oxide semiconductor, which may be vulnerable to an external environment such as high temperature and the like.

The semiconductor layers 135a and 135b may include a channel region where impurities are not doped, and source and drain regions at opposite sides of the channel region where the impurities are doped. The doped impurities may vary depending on types of the thin film transistors, and may be n-type or p-type impurities.

The switching semiconductor layer 135a and the driving semiconductor layer 135b may be divided into channel regions 1355 and source and drain regions 1356 and 1357 formed at opposite sides of the channel region 1355, respectively.

The channel regions 1355 of the switching semiconductor layer 135a and the driving semiconductor layer 135b may include polysilicon that is not doped with the impurities, that is, an intrinsic semiconductor.

The source and drain regions 1356 and 1357 of the switching semiconductor layer 135a and the driving semiconductor layer 135b may include polysilicon that is doped with conductive impurities, that is, an impurity semiconductor.

A gate insulating layer 140 may be formed on the switching semiconductor layer 135a and the driving semiconductor layer 135b. The gate insulating layer 140 may be a single layer or multiple layers including at least one of a silicon nitride and a silicon oxide.

A gate line 121a, a switching gate electrode 125a, and a first capacitor electrode 128 are formed on the gate insulating layer 140.

The gate line 121 may extend in a horizontal direction to transfer a scan signal to the switching transistor Ti. The gate line 121 may include a switching gate electrode 125a protruding to the switching semiconductor layer 135a.

A driving gate electrode 125b may protrude from the first capacitor electrode 128 to the driving semiconductor layer 135b. Each of the switching gate electrode 125a and driving gate electrode 125b may overlap with the channel region 1355.

An interlayer insulating layer 160 may be formed on the gate line 121, the driving gate electrode 125b, and the first capacitor electrode 128. Like the gate insulating layer 140, the interlayer insulating layer 160 may be made of a silicon nitride, a silicon oxide, or the like.

A source contact hole 61 and a 62 exposing the source region 1356 and the drain region 1357, respectively, may be formed in the interlayer insulating layer 160 and the gate insulating layer 140. A storage contact hole 63 exposing a part of the first capacitor electrode 128 may also be formed therein.

A data line 171 having a switching source electrode 176a, a driving voltage line 172 having a driving source electrode 176b and a second storage capacitor 178, and a switching drain electrode 177a and a driving drain electrode 177b connected with the first capacitor electrode 128 may be formed on the interlayer insulating layer 160.

The data line 171 may transfer a data signal and may extend in a direction to cross the gate line 121. The driving voltage line 172 may transfer a driving voltage and may be spaced apart from the data line 171 to extend in the same direction as the data line 171.

The switching source electrode 176a may protrude toward the switching semiconductor layer 135a from the data line 171. The driving source electrode 176b may protrude toward the driving semiconductor layer 135b from the driving voltage line 172.

Each of the switching source electrode 176a and the driving source electrode 176b may be connected to the source region 1356 through the source contact hole 61. The switching drain electrode 177a may face the switching source electrode 176a, and the driving drain electrode 177b faces the driving source electrode 176b.

Each of the switching drain electrode 177a and the driving drain electrode 177b may be connected with the drain region 1357 through the drain contact hole 62.

The switching drain electrode 177a may be extended to be electrically connected with the first capacitor electrode 128 and the driving gate electrode 125b through the contact hole 63 formed in the interlayer insulating layer 160.

The second capacitor electrode 178 may protrude from the driving voltage line 172 to overlap with the first capacitor electrode 128. The first capacitor electrode 128 and the second capacitor electrode 178 may form the storage capacitor Cst by using the interlayer insulating layer 160 as a dielectric material.

The switching semiconductor layer 135a, the switching gate electrode 125a, the switching source electrode 176a, and the switching drain electrode 177a may form the switching transistor Ti. The driving semiconductor layer 135b, the driving gate electrode 125b, the driving source electrode 176b, and the driving drain electrode 177b may form the driving transistor T2.

The switching transistor TI and the driving transistor T2 may correspond to switching elements.

A passivation layer 180 may be formed on the switching source electrode 176a, the driving source electrode 176b, the switching drain electrode 177a, and the driving drain electrode 177b.

A pixel electrode 710 may be formed on the passivation layer 180. The pixel electrode 710 may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel electrode 710 may be electrically connected with the driving drain electrode 177b of the driving transistor T2 through a contact hole 181 formed in the interlayer insulating layer 160 to become an anode of the organic light emitting diode 70.

A pixel defining layer 350 may be formed on the passivation layer 180 and on an edge of the pixel electrode 710. The pixel defining layer 350 may have an opening exposing the pixel electrode 710. The pixel defining layer 350 may include a resin such as a polyacrylate or a polyimide, a silica-based inorganic material, or the like.

An organic emission layer 720 may be formed in the opening of the pixel defining layer 350. The organic emission layer 720 may be formed as a multilayer including one or more of an emission layer, a hole-injection layer (HIL), a hole-transporting layer (HTL), an electron-transporting layer (ETL), and an electron-injection layer (EIL).

In the case where the organic emission layer 720 includes all the above-mentioned layers, the hole-injection layer may be positioned on the pixel electrode 710 which may be an anode, and the hole-transporting layer, the emission layer, the electron-transporting layer, and the electron-injection layer may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer may be formed in a red pixel, a green pixel, and a blue pixel, respectively, thereby implementing a color image.

In some implementations, the organic emission layer 720 may implement the color image by laminating the red organic emission layer, the green organic emission layer, and the blue organic emission layer together in the red pixel, the green pixel, and the blue pixel, and forming a red color filter, a green color filter, and a blue color filter for each pixel.

As another example, white organic emission layers emitting white light may be formed in all of the red pixel, the green pixel, and the blue pixel. A red color filter, a green color filter, and a blue color filter may be formed for respective pixels, thereby implementing the color image. In the case of implementing the color image by using the white organic emission layer and the color filters, the use of a deposition mask for depositing the red organic emission layer, the green organic emission layer, and the blue organic emission layer on respective pixels, that is, the red pixel, the green pixel, and the blue pixel, may be avoided.

In an implementation, a white organic emission layer may be formed by one organic emission layer, and may include a configuration in which a plurality of organic emission layers are laminated to emit white light. For example, the white organic emission layer may include a configuration that may emit white light by combining at least one yellow organic emission layer and at least one blue organic emission layer, a configuration that may emit white light by combining at least one cyan organic emission layer and at least one red organic emission layer, a configuration that may emit white light by combining at least one magenta organic emission layer and at least one green organic emission layer, and the like.

A common electrode 730 may be formed on the pixel defining layer 350 and the organic emission layer 720. The common electrode 730 may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/ aluminum (LiF/Al), aluminum (Al), silver (Ag), magnesium (Mg), or gold (Au). The common electrode 730 may serve as a cathode of the organic light emitting diode 70. The pixel electrode 710, the organic emission layer 720, and the common electrode 730 may make up the organic light emitting diode 70.

An overcoat protecting the organic light emitting diode 70 may be formed on the common electrode 730.

Next, a manufacturing method of the organic light emitting diode display according to an exemplary embodiment will be described. When explaining the manufacturing method of the organic light emitting diode display according to an exemplary embodiment, a detailed description of the same configurations as in the above-described organic light emitting diode display is not repeated.

FIG. 10 to FIG. 14 illustrate views sequentially showing a manufacturing process of an organic light emitting diode display according to an exemplary embodiment.

Figure 10:
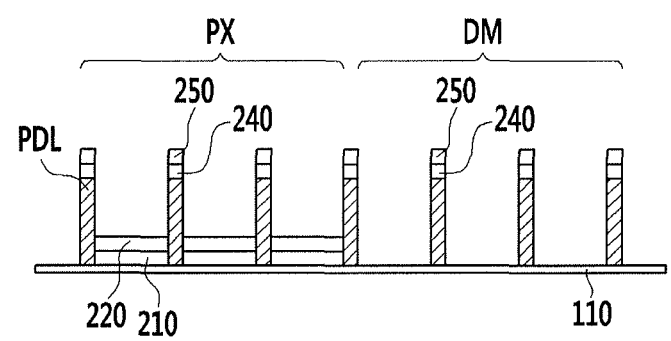
FIG. 10 to FIG. 14 illustrate views sequentially showing stages of a manufacturing process of an organic light emitting diode display according to an exemplary embodiment.

First, as shown in FIG. 10, a first electrode (for example, a pixel electrode 710 as shown in FIGS. 8 and 9) may be formed in the display pixel area PX on a substrate 110. As described above, the first electrode may be formed of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The first electrode may be electrically connected to the driving drain electrode of the driving thin film transistor T2, thereby being the anode of the organic light emitting element.

The substrate 110 may include the display pixel area PX made of the plurality of pixels displaying the image and the dummy pixel area DM formed near the display pixel area PX.

In some implementations, before forming the first electrode on the substrate 110, the thin film transistor may be formed in the display pixel area PX. The thin film transistor may be electrically connected to the first electrode. In some implementations, the thin film transistor may also be formed in the dummy pixel area DM in addition to in the display pixel area PX. The thin film transistor formed in the dummy pixel area DM may be used for a repair.

Next, a pixel definition layer PDL defining the pixel area may be formed on the first electrode. As described above, the red, green, and blue sub-pixels R, G, and B may be formed in the pixel area defined by the pixel definition layer PDL. The pixel definition layer PDL may have an opening exposing the underlying first electrode. The pixel definition layer PDL may include a resin such as a polyacrylate or polyimide, a silica-based inorganic material, or the like.

Figure 11:
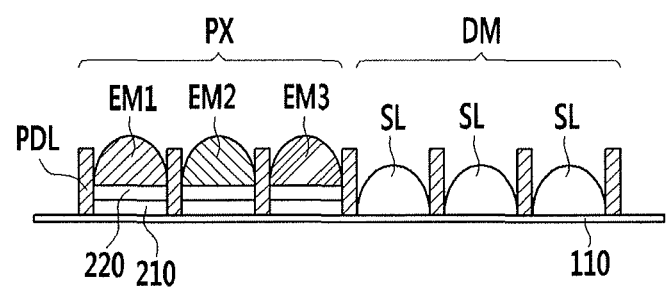

As shown in FIG. 11, the emission material and the solvents EM1, EM2, and EM3 dissolved with the emission material are dripped one the pixel area in the display pixel area PX. The emission material forms the organic emission layer 230 in each sub-pixel. In this case, the emission material may include a polymer having high solubility as the organic emission material.

According to an exemplary embodiment, only the solvent SL is dripped onto the dummy pixel area DM. For example, the emission material and the solvent dissolved with the emission material may be simultaneously dripped onto the display pixel area PX and only the solvent may be dripped without the emission material onto the dummy pixel area DM. When the emission material is not dripped onto the dummy pixel area DM, the organic emission layer is not formed in the dummy pixel area DM, differently from the display pixel area PX.

The substrate dripped with the emission material and the solvent may be dried. For example, the display pixel area PX and the dummy pixel area DM may dried. By the drying process, the solvent dripped onto the substrate 110 is removed and only the emission material remains.

Figure 12:
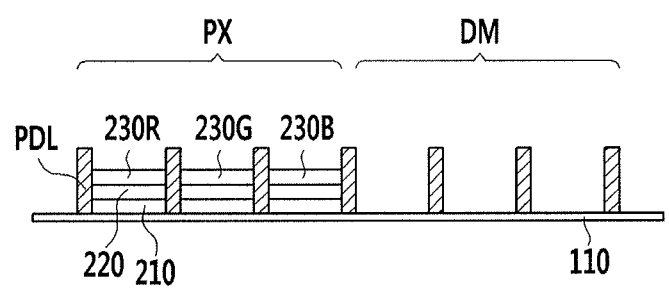

As shown in FIG. 12, the organic emission layers 230R, 230G, and 230B may be formed by the remaining emission material in the display pixel area PX. In contrast, the organic emission layer is not formed in the dummy pixel area DM. For example, when the emission material is not present in the dummy pixel area DM, a separate layer is not formed.

When the emission material is not dripped in the dummy pixel area DM and only the solvent is dripped and dried, the shape of the organic emission layer 230R, 230G, and 230B of the display pixel area PX adjacent to the dummy pixel area DM may be more uniform.

As described above, if the emission material and the solvent were to be dripped and dried on the substrate in the dummy pixel unit, as in the display pixel area PX, the surface of the organic emission layers 230R', 230G', 230B' of the display pixel area PX adjacent to the dummy pixel area DM may not be flat, due to a coffee stain effect that affects the emission material positioned at the edge of the solvent while the solvent is dried. Accordingly, the luminance non-uniformity could be caused in the organic light emitting diode display.

According to the manufacturing method of the organic light emitting diode display according to an exemplary embodiment, if the solvent without the emission material is dripped and dried in the dummy pixel unit DM, the above phenomenon may be reduced.

The second electrode 250 may be commonly formed in the display pixel area PX and the dummy pixel area DM. The second electrode 250 may be formed of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/ aluminum (LiF/Al), aluminum (Al), silver (Ag), magnesium (Mg), or gold (Au).

According to the described exemplary embodiment, the emission material and the solvent may be directly dripped on the first electrode in the display pixel area PX. In other implementations, before dripping the emission material and the solvent, the hole injection layer 210 and the hole transporting layer 220 may be sequentially formed on the first electrode. In this case, the hole injection layer or the hole transporting layer may also be formed in the dummy pixel area DM.

Figure 13:
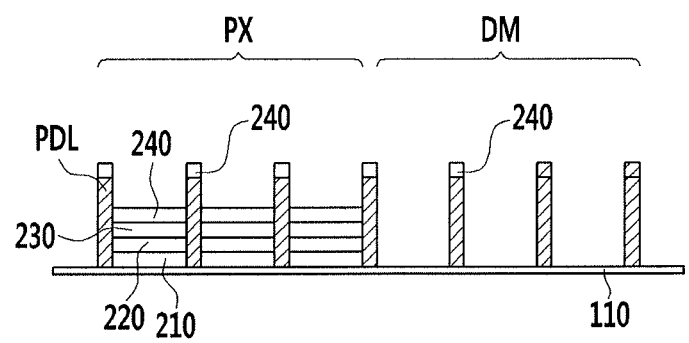
Figure 14:
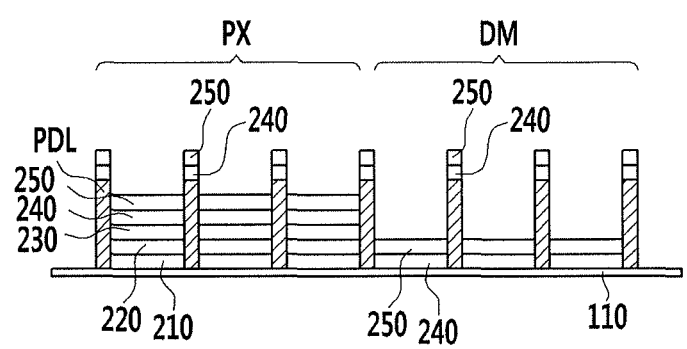

Also, according to the described exemplary embodiment, the second electrode 250 may be formed after forming the organic emission layer 230 in the display pixel area PX. In other implementations, after performing the drying process, as shown in FIG. 13, the electron transporting layer 240 may be commonly formed in the display pixel area PX and the dummy pixel area DM. In this case, the electron transporting layer 240 may be simultaneously formed in the display pixel area PX and the dummy pixel area DM. In other implementations, only the electron transporting layer 240 may be formed in the display pixel area PX.

By way of summation and review, to form the organic material of an organic light emitting diode display, an injection printing method of dripping an emission material with a solvent in the pixel area may be used. However, a surface of the organic emission layer formed by the emission material may be non-uniform in the display pixel area near a dummy pixel area, thereby generating pixel non-uniformity.

Embodiments provide an organic light emitting diode display whereby pixel non-uniformity issues are addressed and a manufacturing method thereof. Embodiments provide an organic light emitting diode display addressing pixel non-uniformity issues that may be due to a surface non-uniformity of the organic emission layer formed by an inkjet printing method, and a manufacturing method thereof. According to the organic light emitting diode display and the manufacturing method thereof, the surface of the organic emission layer of the display pixel area adjacent to the dummy pixel area may be uniform, thereby addressing the pixel non-uniformity issues that may be generated in the display pixel area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting diode display, comprising:
   a substrate;
   a display pixel unit that displays an image, the display pixel unit being on the substrate; and
   a dummy pixel unit near the display pixel unit on the substrate,
   wherein the display pixel unit includes:
   a first electrode on the substrate;
   an organic emission layer on the first electrode; and
   a second electrode on the organic emission layer, and
   the dummy pixel unit includes a second electrode formed on the substrate and does not include an organic emission layer.

2. The organic light emitting diode display as claimed in claim 1, wherein the display pixel unit further includes:
   a hole injection layer on the first electrode;
   a hole transporting layer between the hole injection layer and the organic emission layer; and
   an electron transporting layer between the organic emission layer and the second electrode.

3. The organic light emitting diode display as claimed in claim 2, wherein the display pixel unit further includes an electron injection layer between the electron transporting layer and the second electrode.

4. The organic light emitting diode display as claimed in claim 1, wherein the dummy pixel unit further includes an electron transporting layer between the substrate and the second electrode.

5. The organic light emitting diode display as claimed in claim 4, wherein the dummy pixel unit further includes a hole injection layer between the substrate and the electron transporting layer.

6. The organic light emitting diode display as claimed in claim 1, further comprising
   a thin film transistor between the substrate and the display pixel unit, the thin film transistor being connected to the first electrode of the display pixel unit.

7. The organic light emitting diode display as claimed in claim 6, wherein
   the thin film transistor includes:
   an active layer positioned on the substrate;
   a gate electrode positioned on the active layer; and
   a source electrode and a drain electrode positioned on the gate electrode and connected to the active layer, the drain electrode being connected to the first electrode of the display pixel unit.

8. A method for manufacturing an organic light emitting diode display, the method comprising:
   providing a substrate including a display pixel area that displays an image and a dummy pixel area formed near the display pixel area;
   forming a first electrode on the substrate in the display pixel area;
   forming a pixel definition layer defining a pixel area on the first electrode in the display pixel area;
   dripping an emission material and a solvent dissolved with the emission material onto the display pixel area;
   dripping a solvent without the emission material onto the dummy pixel area on the substrate;
   drying the substrate onto which the emission material and the solvent are dripped; and
   forming a second electrode in the display pixel area and the dummy pixel area on the substrate.

9. The method as claimed in claim 8, further comprising, before dripping the emission material and the solvent in the display pixel area:
   forming a hole injection layer on the first electrode in the display pixel area; and
   forming a hole transporting layer on the hole injection layer.

10. The method as claimed in claim 9, further comprising, after drying the substrate and before forming the second electrode:
    forming an electron transporting layer in the display pixel area and the dummy pixel area of the substrate.

11. The method as claimed in claim 9, wherein
    forming the hole injection layer includes forming the hole injection layer in the dummy pixel area.

12. The method as claimed in claim 8, further comprising, before forming the first electrode:
    forming a thin film transistor in the display pixel area on the substrate.

13. The method as claimed in claim 12, wherein the thin film transistor includes:
    an active layer positioned on the substrate;
    a gate electrode positioned on the active layer; and
    a source electrode and a drain electrode positioned on the gate electrode and connected to the active layer, the drain electrode being connected to the first electrode.

* * * * *